United States Patent [19]

Unsworth et al.

[11] Patent Number: 5,488,281

[45] Date of Patent: Jan. 30, 1996

[54] METHOD AND APPARATUS FOR PREDICTING WINDING FAILURE USING ZERO CROSSING TIMES

[75] Inventors: Peter J. Unsworth, Lewes, England; Yuan Wang, Jiading, China

[73] Assignee: Allen-Bradley Company, Inc., Milwaukee, Wis.

[21] Appl. No.: 314,472

[22] Filed: Sep. 28, 1994

[51] Int. Cl.$^6$ ................................................. H02P 7/36
[52] U.S. Cl. ........................... 318/806; 318/798; 318/805
[58] Field of Search .................................. 318/798–815, 318/636, 638, 476; 364/550, 474.12, 178; 388/907.5, 909

[56] References Cited

U.S. PATENT DOCUMENTS

| | | | |
|---|---|---|---|
| 4,481,448 | 11/1984 | Bishop | 318/805 |
| 4,851,744 | 7/1989 | Kotzur et al. | 388/909 |
| 5,334,923 | 8/1994 | Lorenz et al. | 318/805 |
| 5,450,306 | 9/1995 | Garces et al. | 318/811 |

*Primary Examiner*—William M. Shoop, Jr.
*Assistant Examiner*—Karen Masih
*Attorney, Agent, or Firm*—Michael A. Jaskolski; John J. Horn; George A. Montanye

[57] ABSTRACT

A method and apparatus to be used with a motor controller for determining the degree of rotor winding failure and stator winding failure using current zero crossing times of the stator winding currents. An error signal sequence, consisting of phase angle errors between consecutive zero crossings over a sampling period, is generated and analyzed in different regions of interest in either the time or frequency domain, producing signals with varying amplitudes, the signal amplitudes together with other motor parameter measurements being used to determine the degree of rotor winding failure and stator winding failure.

23 Claims, 6 Drawing Sheets

$\frac{\pi}{6} - \frac{\gamma}{2}$  $\frac{\pi}{6} + \frac{\gamma}{2}$  $\frac{\pi}{2} - \frac{\gamma}{2}$ 5,488,281

METHOD AND APPARATUS FOR PREDICTING WINDING FAILURE USING ZERO CROSSING TIMES

BACKGROUND OF THE INVENTION

1. Field of the Invention

The present invention relates to techniques for predicting rotor winding failure, and predicting stator winding failure; and particularly to techniques which utilize current zero crossing times of stator currents to predict stator and rotor winding failure.

2. Description of the Art

One type of commonly designed induction motor is a three-phase motor having three Y-connected stator windings. In this type of motor, each stator winding is connected to an AC-voltage source by a separate supply line, the source generating an alternating current therein.

As the stator currents alternate, a wave of magnetic field flux, directed radially toward the rotor, rotates around the axis of the motor. The relative motion between the stator flux wave and the rotor windings induces an alternating voltage and current in each of the rotor windings. The alternating rotor currents, in turn, produce a magnetic rotor flux, directed radially toward the stator. Because of the interaction between the flux fields, the rotor experiences a force tending to rotate the rotor as the stator currents alternate.

While modern power stations supply well-balanced three-phase voltages having identical periods and amplitudes and having phases which differ by exactly 120 degrees, it is not uncommon for the voltages at the point of utilization in AC motors to be unbalanced. Unbalanced stator terminal voltages, and the resulting unbalanced stator currents, are generally recognized as undesirable for a plurality of reasons.

Asymmetrical stator and rotor windings are two sources of unbalanced stator winding voltages and currents. While great effort is taken to manufacture symmetrical stator and rotor windings, over the course of time, windings can become asymmetrical as their properties change though heavy industrial use. Asymmetrical stator windings produce unbalanced currents through the three stator windings.

Even where stator windings are symmetrical, if the rotor windings become asymmetrical, the rotor flux will be unbalanced. As known in the art, rotor flux induces back EMFs in the stator windings. If the rotor flux is unbalanced, the back EMFs are also unbalanced and influence the stator currents. Thus, asymmetrical rotor windings can act as a second source of stator current unbalance.

Importantly, even a small supply voltage unbalance can result in a relatively large current unbalance in the stator windings of a three-phase motor. This phenomenon can be understood by representing an unbalanced voltage as a combination of a normal three-phase positive sequence voltage component, plus a small negative sequence voltage, which on its own would drive the motor in the reverse direction.

As well known in the art, the stator windings present only a very small impedance to the negative sequence voltage component. As current equals voltage divided by impedance, dividing the negative sequence voltage by a small impedance produces a large negative current component. In some cases, where there is a 3% voltage unbalance, as a result of the negative current component the stator current unbalance might be as high as 18%–24%.

Unbalanced currents deliver uneven power to the rotor and thus produce undesirable torque pulsations and motor vibrations. The vibrational forces caused by the vibrating motor accelerate deterioration of the mechanical components of the motor including the rotor and stator windings. If the motor is operating at or near its fully-rated load, the rotor and the stator windings carrying increased current heat up unnecessarily. While extreme overheating may trip an overload relay to switch off the motor and protect it from burning out, lesser degrees of unbalance usually go unchecked as the heat generated is insufficient to trip the overload relay.

Excess heat causes motor insulation to age at an accelerated rate and causes accelerated deterioration and evaporation of the bearing and other lubricants both of which shorten the useful life of a motor. In addition, the excess motor heat is lost energy which means the motor is running inefficiently.

Thus, predicting stator winding and rotor winding faults is important in order to prolong the useful life of a motor, and to prevent unexpected motor failure which may interrupt important processes. However, predicting winding failure before catastrophic failure occurs is complicated by the fact that winding deterioration is a slow, gradual process up to a point, after which there may be a sharp increase in asymmetry and thus a sharp increase in the potential for motor damage. If winding failure can be detected at an early stage, preventative maintenance can be scheduled, and causes of failure investigated, at convenient times, without disrupting operations.

Because the effects of stator and rotor failure are not easily observed, in many instances, failure cannot be detected until after costly motor damage has resulted. The motor control industry has not come up with a simple way to discover the initial signs of eventual winding failure. Because most industrial size stators and rotors have complex winding patterns, it is not practical to predict motor failure from a visual inspection of the windings. Furthermore, even where a motor employs relatively simple winding configurations, it would be extremely burdensome for a user to dismantle a motor on a regular basis in order to inspect the windings for damage.

One way to predict stator and rotor winding failure might be to use sensors which could track stator current unbalance to discover the initial signs of failure. However, an elementary measurement of the magnitude of current unbalance is not helpful as there are many sources of unbalance in addition to winding asymmetry (i.e. non-uniform distribution of electrical load, unmatched transmission impedance between the source and the motor . . . ). The source to which unbalance is attributable cannot be deciphered simply by tracking the extent of unbalance.

Therefore, it would be helpful to have a method and/or an apparatus for use with a motor controller which could predict stator winding and rotor winding failure at an early stage of deterioration using the computational abilities of the motor controller.

SUMMARY OF THE INVENTION

The present invention is a method for predicting stator winding failure and rotor winding failure by observing current zero crossing times of stator currents. The method is to be used with a motor controller which provides stator winding currents at a frequency of X cycles per second and indicates zero crossing times when each phase current reaches or crosses zero. The controller also provides a set of healthy rotor signal data, an acceptable rotor error value, and a sampling period. The motor has p poles. The method comprises the steps of generating a plurality of error signals over the sampling period, each error signal indicating the variation in the interval between consecutive current zero crossings, the error signals together have a frequency spectrum indicative of the time variations of the interval, analyzing the error signal spectrum to determine a signal amplitude of a dominant signal component within a region of interest, the region of interest being within $K((2X/p)-n)$ and $K(2X/p)$ Hz, where n is less than $2x/p$ and K is an integer, determining a slip value indicating the difference between stator current frequency and the rotor speed frequency, multiplying the signal amplitude by the slip value to produce a rotor signal, and comparing the rotor signal to the healthy rotor signal data to produce a rotor error signal indicative of the degree of rotor winding failure.

Therefore, it is one object of the invention to produce a method by which a conventional motor controller can predict rotor winding failure using information already known to the controller. Many motor controllers already measure current zero crossing times to monitor and control other various parameters, and thus, no additional hardware is needed to predict the degree of rotor winding failure. Furthermore, no additional measurements are needed to predict the degree of failure.

Another object of the invention is to take advantage of a newly realized relationship between rotor winding failure and stator current zero crossing information. It has been realized that a small back EMF in the stator caused by rotor unbalance produces a periodic distortion in the stator current thus periodically affecting the current zero crossings. As the rotor frequency is slightly less than the stator current frequency in an induction motor due to slip, the approximate rotor frequency is known. By generating an error signal spectrum representative of the periodic fluctuations between consecutive current zero crossings, and then distilling a rotor component within the approximate rotor frequency range, the rotor frequency can be ascertained. As the rotor is normally the only source of unbalance in its frequency range, the amplitude of the rotor component is indicative of the extent of unbalance due to, and thus the degree of failure of the rotor windings.

The step of generating a plurality of error signals may include the steps of receiving and measuring the time of occurrences of consecutive zero crossing signals from the motor controller, subtracting each zero crossing time from a preceding consecutive zero crossing time to produce a plurality of difference values, and subtracting the mean difference value which is 1/6th of the stator period from each difference value to produce the plurality of error signals, which vary about zero.

After obtaining the spectrum of the error signals, the step of analyzing the error signal spectrum may include the step of determining a signal frequency of said dominant rotor component which will be a measurement of motor speed, and the step of determining a slip value may include the steps of dividing the signal frequency by $2X/p$ to produce a frequency ratio and subtracting the frequency ratio from the integer one to produce the slip value.

Thus, another object of the invention is to take advantage of a newly realized relationship between rotor speed and stator current zero crossing information to determine a slip value. As discussed above, the rotor frequency can be ascertained from an observation of the fluctuation between consecutive zero crossings. Then, as both rotor frequency and stator flux frequency are known, the slip value can easily be determined as known in the art.

In the alternative, the controller may provide a slip value and the step of determining a slip may include the step of receiving the slip value from the controller.

The step of obtaining the error signal spectrum may include the steps of performing a fast Fourier transform on the sequence of error signals to produce an FFT spectrum and examining said FFT spectrum within the frequency region of interest to find a signal frequency and a signal amplitude.

In a preferred method, the step of analyzing the error signal spectrum includes the steps of passing the sequence of error signals through a bandpass filter passing signals having a frequency within the region of interest, to produce a rotor component and determining a signal frequency and a signal amplitude of the rotor component.

The method of the present invention is particularly useful where p is 4, X is 60 Hz, n is at most 3 Hz, K is 1, and the predetermined period is approximately one second. The method may also include the step of displaying the rotor error signal. The present invention also includes an apparatus to be used with the above described method and motor controller.

The present invention also includes a method for predicting stator winding failure. This method is to be used with a motor controller wherein the controller provides three phase supply line voltages and stator winding currents at a frequency of X Hz and indicates zero crossing times when each current crosses or becomes zero. The controller also provides a set of stator signal data and a sampling period, the motor being of a design having p poles.

This method comprises the steps of generating a plurality of error signals over the sampling period, each error signal indicating the variation in interval between consecutive current zero crossings, generating an error signal frequency spectrum from the sequence of error signals, analyzing the error signal spectrum to determine a harmonic amplitude of a stator component of the error signal spectrum at 2X Hz which is the second harmonic of the supply frequency, the harmonic amplitude being the first element in a coordinate pair, sampling supply voltages over the sampling period, splitting the supply voltages into a positive sequence voltage and a negative sequence voltage, dividing the negative sequence voltage by the positive sequence voltage to produce a voltage ratio, the voltage ratio being the second coordinate in the coordinate pair, the harmonic amplitude and the voltage ratio together forming a coordinate pair, and comparing the coordinate pair to the stator signal data to produce a stator error signal.

Thus, another object of the invention is to produce a method by which a conventional motor controller can determine the degree of stator winding failure using information already known to the controller. As current zero crossing times and supply voltages are already measured by the motor controller in order to control other motor parameters, no additional hardware is needed to determine the degree of stator winding failure. Furthermore, no additional measurements are needed to determine the degree of stator winding failure.

Another object of the invention is to take advantage of a newly realized relationship between stator winding failure and current zero crossing information. It has been realized that stator winding failure caused periodic distortions at a frequency of 2X Hz in the stator current, thus periodically affecting the current zero crossing times. By generating an error signal spectrum representative of the period fluctuations between consecutive current zero crossings, and then distilling a 2X frequency stator component, information regarding the degree of stator winding failure can be ascertained.

Yet another object of the invention is to correlate zero crossing information with other measured motor parameters to separate the unbalance due to stator winding failure at 2X Hz from unbalance due to other sources at 2X Hz. As both the supply and the stator windings affect the stator component at 2X Hz by forming a coordinate pair including the harmonic amplitude and the voltage ratio, and then comparing the coordinate pair to the stator signal data, the negative sequence voltage due to the supply can be eliminated and a new harmonic amplitude due solely to the degree of stator winding failure can be determined.

In a preferred method, the set of stator signal data includes data describing a curve on a graph, the curve representing harmonic amplitudes plotted against voltage ratios. The degree of stator winding fault is revealed by the deviation in the distance of the harmonic amplitude of the curve from zero at the position where the voltage ratio co-ordinate is zero, being different for each curve, and the step of comparing the coordinate pair to the stator signal data includes the steps of locating a coordinate point on one of the curves, the coordinate point corresponding to the coordinate pair, determining on which curve said coordinate point is located, and producing the error signal indicating on which curve the coordinate point is located.

The invention also includes an apparatus to be used with a motor controller for predicting both rotor and stator winding failure. Other and further aspects of the present invention will become apparent during the course of the following description and by reference to the accompanying drawings.

DETAILED DESCRIPTION OF THE PREFERRED EMBODIMENTS

Figure 1:
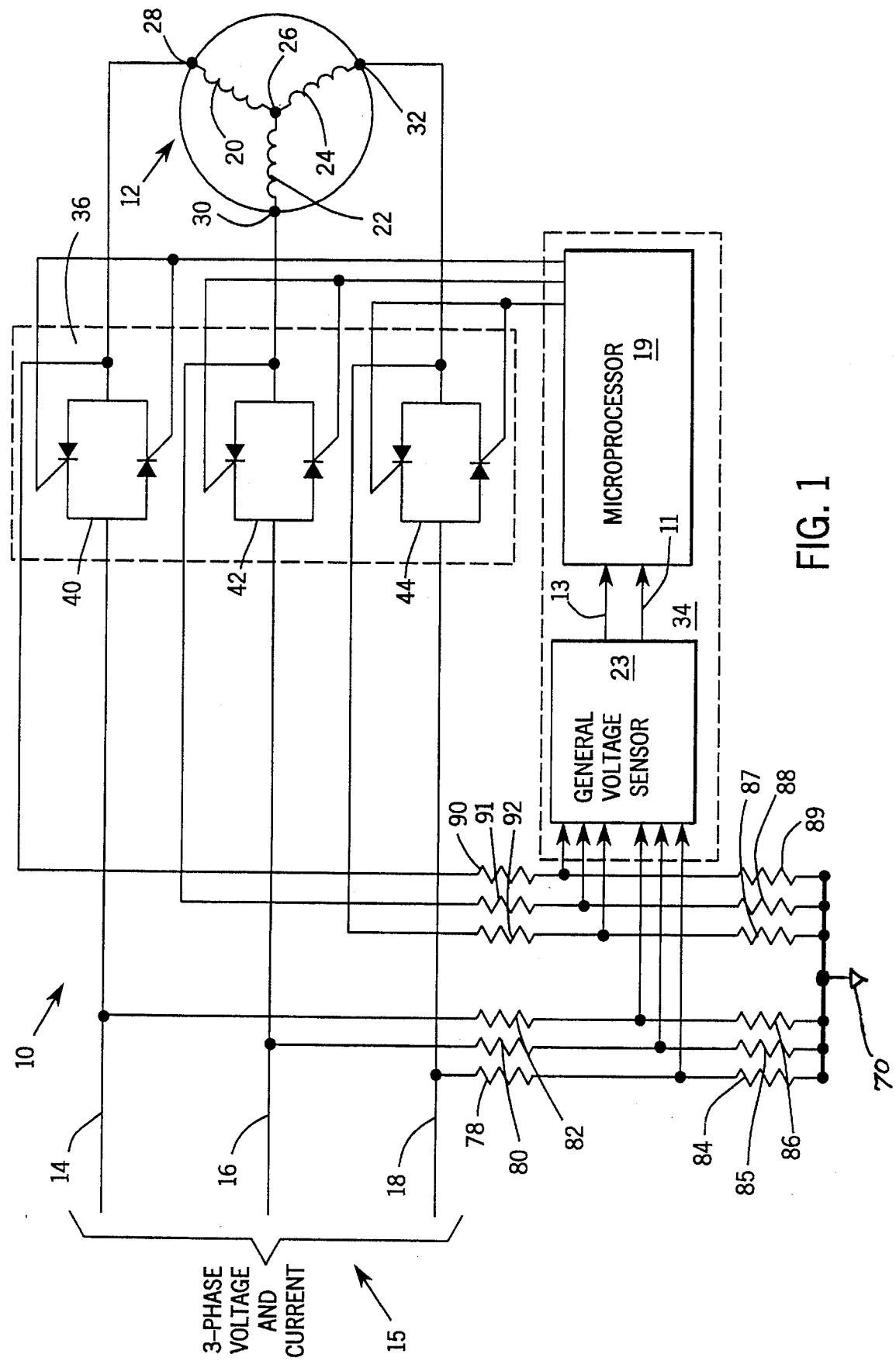
FIG. 1 is a schematic diagram of a motor and a controller which incorporates the present invention.

The present invention will be described in the context of the exemplary motor control system 10 shown in FIG. 1. The control system 10 detects zero crossing times on, and line voltages across, each of three stator windings 20, 22, and 24 in a manner to be described below, and uses that information to predict both stator and rotor failure.

The induction motor 12 has three stator windings 20, 22, 24 which are coupled in a Y-configuration at neutral node 26. The distal end of each stator winding 20, 22, or 24 is connected to a supply line 14, 16, or 18 at a motor terminal 28, 30, or 32 respectively. The phase of the voltage on supply line 14 leads the phase of the voltage on supply line 16 which in turn leads the phase voltage on supply line 18.

The motor control system 10 consists of a control module 34, a thyristor switch module 36, and a plurality of other components which will be described in more detail below. Within the control module 34, there is an SCR voltage sensor 23 which feeds current zero crossing information to a microprocessor 19.

The thyristor switch module 36 has three separate thyristor switches 40, 42, 44. Each thyristor switch 40, 42, 44 consists of a pair of inversely connected silicon controlled rectifiers (SCR's). Each thyristor switch 40, 42, 44 is used to control the voltage on, and current through, an associated supply line 14, 16 or 18 for altering current supplied to, and voltage across the terminals of the motor 12.

Figure 2A:
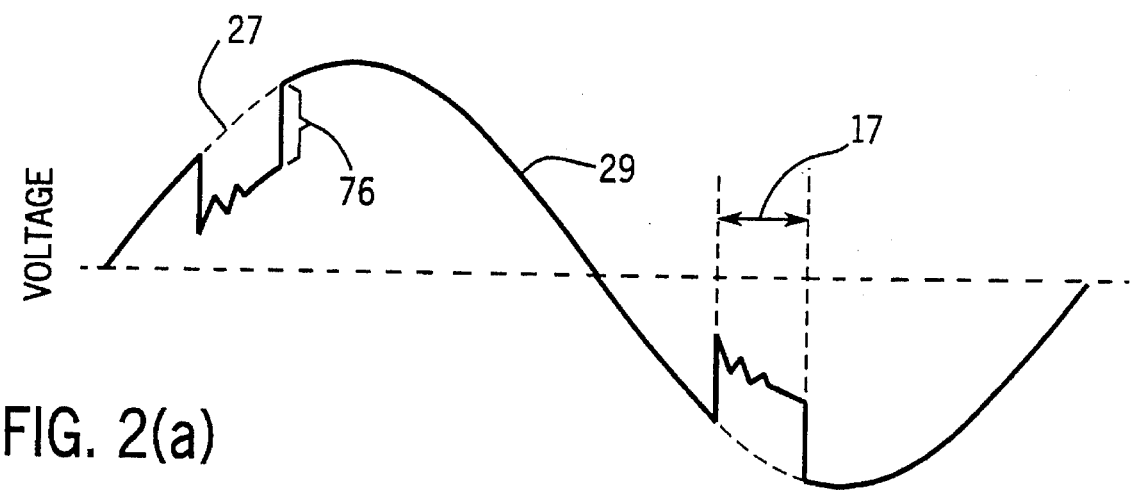
FIGS. 2(a) and 2(b) are graphs illustrating the voltage across and current through a pair of SCR's in FIG. 1 as a function of time.
Figure 2B:
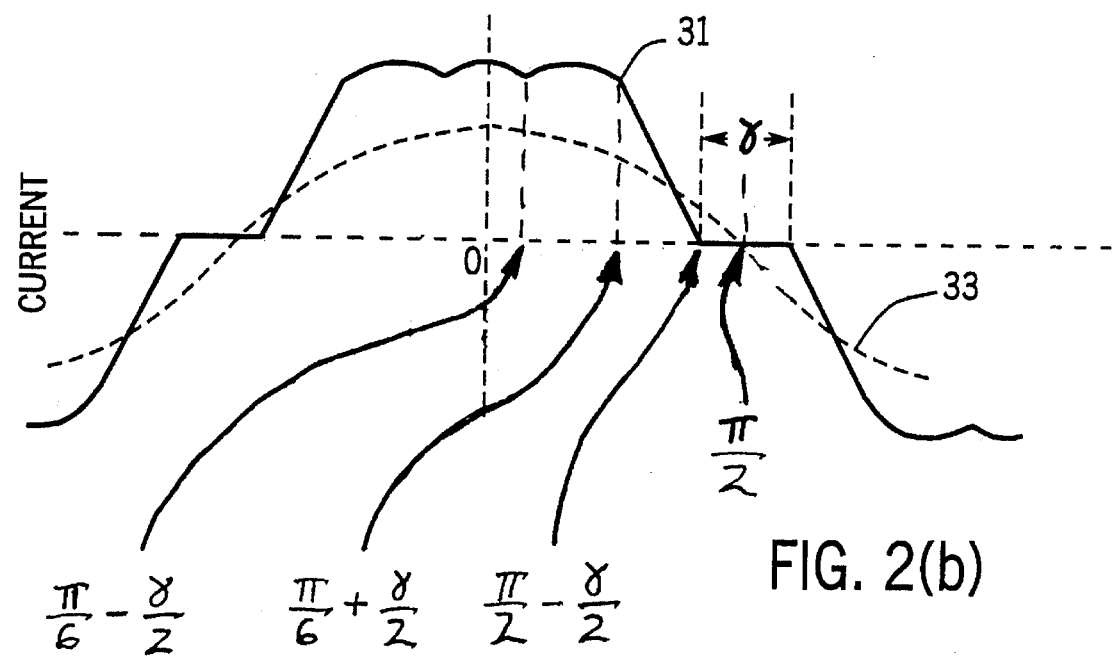

Referring also to FIGS. 2(a) and 2(b), the current and voltage on a single supply line 14, 16 or 18 may be compared to the current and voltage of the AC source 15. In FIG. 2(a), the supply voltage 27 is sinusoidal. The terminal voltage 29 is generally identical to the supply voltage 27, except for during a small non-conducting time, or notch 17 having a duration of γ, which is introduced into each half cycle of supply voltage 27. The notch 17 is introduced into the supply voltage 27 each time an associated line current 31 becomes zero. The line current 31 remains zero until the end of the notch 17, at which time the current 31 continues a pulsating waveform having a fundamental frequency sinusoidal component 33 which generally lags the terminal voltage 29 by the angle of the power factor of the motor. The fundamental component of the line current reaches zero in the middle of notch 17.

The control system 10 used with the present invention alters RMS supply line current by controlling the period of notch 17. During the duration γ, the thyristor pair comprising one thyristor switch 40, 42 or 44 and connecting one stator winding 20, 22 or 24 to the voltage source operates as an open circuit, so that, instead of observing the sinusoidal supply voltage at the terminal 28, 30 or 32, an internally generated motor back EMF voltage 76 may be seen. This gives the notch 17 in the observed waveform at the terminal 28, 30 or 32.

Generating an Error Signal Spectrum

Figure 3A:
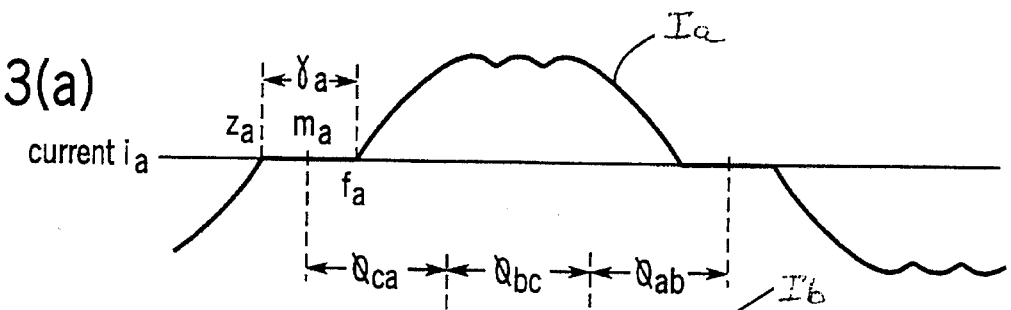
FIGS. 3(a), 3(b) and 3(c) are graphs illustrating the currents through the three supply lines in FIG. 1 as a function of time.
Figure 3B:
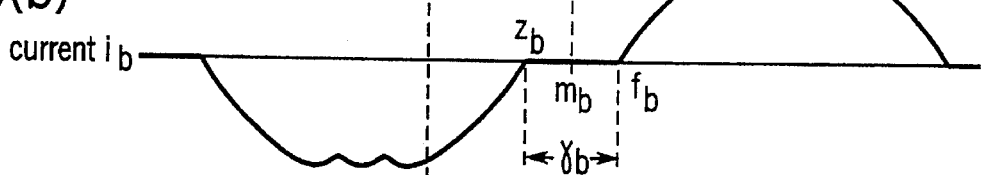
Figure 3C:
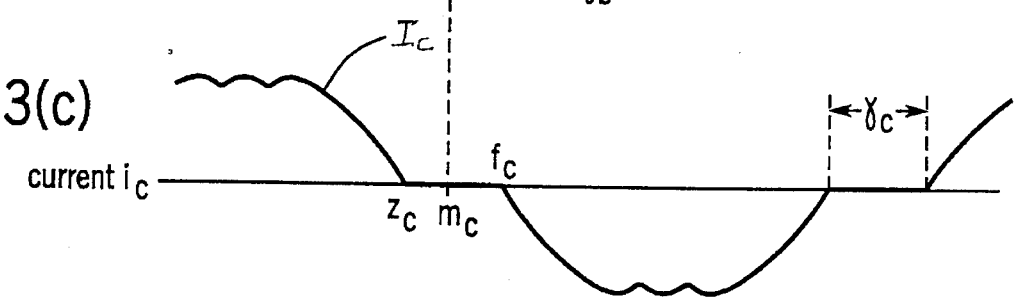

In order to understand how the control module 34 predicts both rotor and stator failure, it is necessary to understand the relationships between voltages, currents and phase angles in a three phase system. Referring to FIGS. 3(a), 3(b) and 3(c), the three curves represent line currents $I_a$, $I_b$ and $I_c$ corresponding to voltages $V_a$, $V_b$ and $V_c$ on the supply lines 14, 16, 18 respectively. For an induction motor with symmetrical windings and a balanced three phase supply voltage, $$\vec{V}_a + \vec{V}_b + \vec{V}_c = 0; \tag{1}$$

$$|\vec{V}_a|=|\vec{V}_b|=|\vec{V}_c|; \quad (2)$$

$$|\vec{I}_a|=|\vec{I}_b|=|\vec{I}_c|; \quad (3)$$

$$\vec{I}_a+\vec{I}_b+\vec{I}_c=0; \quad (4)$$

and, $$\phi_{ab}=\phi_{bc}=\phi_{ca}=60° \quad (5)$$

where $\phi_{ab}$, $\phi_{bc}$, $\phi_{ca}$ are the phase angles between the zero crossing points for the fundamental components of the three phase currents $I_a$, $I_b$ and $I_c$.

Figure 4:
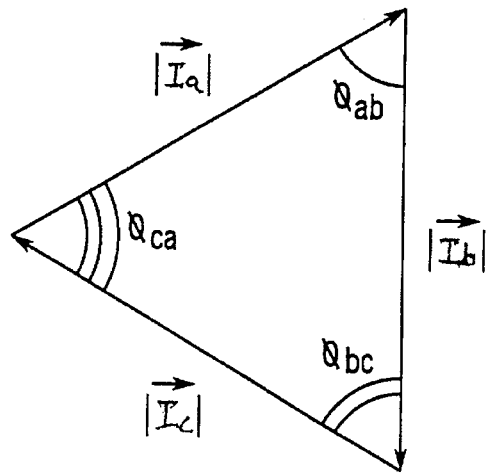
FIG. 4 is a vector diagram showing the geometric relationship between currents and phase angles in a three phase motor.

Referring also to FIG. 4, because of the relationships between currents $I_a$, $I_b$, and $I_c$ and their associated phase angles $\phi_{ab}$, $\phi_{bc}$, and $\phi_{ca}$ expressed in Equations 3, 4, and 5, these currents and angles can be represented by a triangle where the sides correspond to current magnitudes I+e,rar $I_{a+ee}$ I, I+e,rar $I_{b+ee}$ I, and I+e,rar $I_{c+ee}$ I and the angles correspond to phase angles $\phi_{ab}$, $\phi_{bc}$, and $\phi_{ca}$. Using well known geometric theorems, the relationships between the current magnitudes and phase angles in FIG. 4 can be represented as:

$$\frac{|\rightarrow I_a|}{\sin(\phi_{bc})}=\frac{|\rightarrow I_b|}{\sin(\phi_{ca})}=\frac{|\rightarrow I_c|}{\sin(\phi_{ab})}=G \quad (6)$$

where G is a constant. Solving Equation 6 for I+e,rar $I_{a+ee}$ I, I+e,rar $I_{b+ee}$ I and I+e,rar $I_{c+ee}$ I:

$$\text{I+e,rar } I_{a+ee} \text{ I}=G^* \sin(\phi_{bc}) \quad (7)$$

$$\text{I+e,rar } I_{b+ee} \text{ I}=G^* \sin(\phi_{ca}) \quad (8)$$

$$\text{I+e,rar } I_{c+ee} \text{ I}=G^* \sin(104_{ab}). \quad (9)$$

It can be seen from Equations 7, 8, and 9 that the amplitudes of the currents $I_a$, $I_b$, and $I_c$ are proportional to the phase angles $\phi_{bc}$, $\phi_{ca}$, and $\phi_{ab}$ respectively.

Therefore, when all the phase angles $\phi_{bc}$, $\phi_{ca}$, and $\phi_{ab}$ are equal to 60°, I+e,rar $I_{a+ee}$ I, I+e,rar $I_{b+ee}$ I, and I+e,rar $I_{c+ee}$ I are equal and the system is balanced. When any phase angle $\phi_{bc}$, $\phi_{ca}$, or $\phi_{ab}$ is not equal to 60°, the system is unbalanced. Thus, by determining the phase angles $\phi_{bc}$, $\phi_{ca}$, and $\phi_{ab}$ information concerning unbalance can be obtained.

Referring again to FIGS. 3(a), 3(b) and 3(c), points $z_a$, $z_b$, and $z_c$ are the instances when currents reach zero. Points $f_a$, $f_b$, and $f_c$ are the firing times of the thyristor switches 40, 42, 44. The notches $\gamma_a$, $\gamma_b$, and $\gamma_c$ are the intervals between associated z and f points. Since the fundamental component of line current mainly determines the operating performance of an induction motor, the phase angles $\phi_{ab}$, $\phi_{bc}$, and $\phi_{ca}$ between the three phase fundamental current components are of particular interest. In FIGS. 3(a), 3(b), and 3(c), $m_a$, $m_b$, and $m_c$ represent the zero crossing points for the fundamental component of each line current $I_a$, $I_b$, and $I_c$ and are the midpoints between associated z and f points.

Referring again to FIG. 1, most motor controllers 34 directly monitor the voltage across the thyristors 40, 42, 44. In FIG. 1, each supply line 14, 16, or 18 is coupled by a separate resistor 78, 80, or 82 to the inputs of the SCR voltage sensor 23. Resistors 90, 91, and 92 couple motor terminals 28, 30, and 32 to inputs of the SCR voltage sensor 23.

Six additional resistors 84–89, couple the inputs of the SCR voltage sensor 23 to a control circuit ground 70, thereby forming voltage dividers with resistors 78, 80, 82, 90, 91, and 92. The SCR voltage sensor 23 determines the times at which each thyristor 40, 42, 44 is conducting and therefore effectively short circuited. At these times, the current in an associated line 14, 16, or 18 crosses zero. When the SCR voltage sensor 23 detects a zero crossing $z_a$, $z_b$, or $z_c$, it sends a signal to the microprocessor 19 along line 13.

Figure 5:
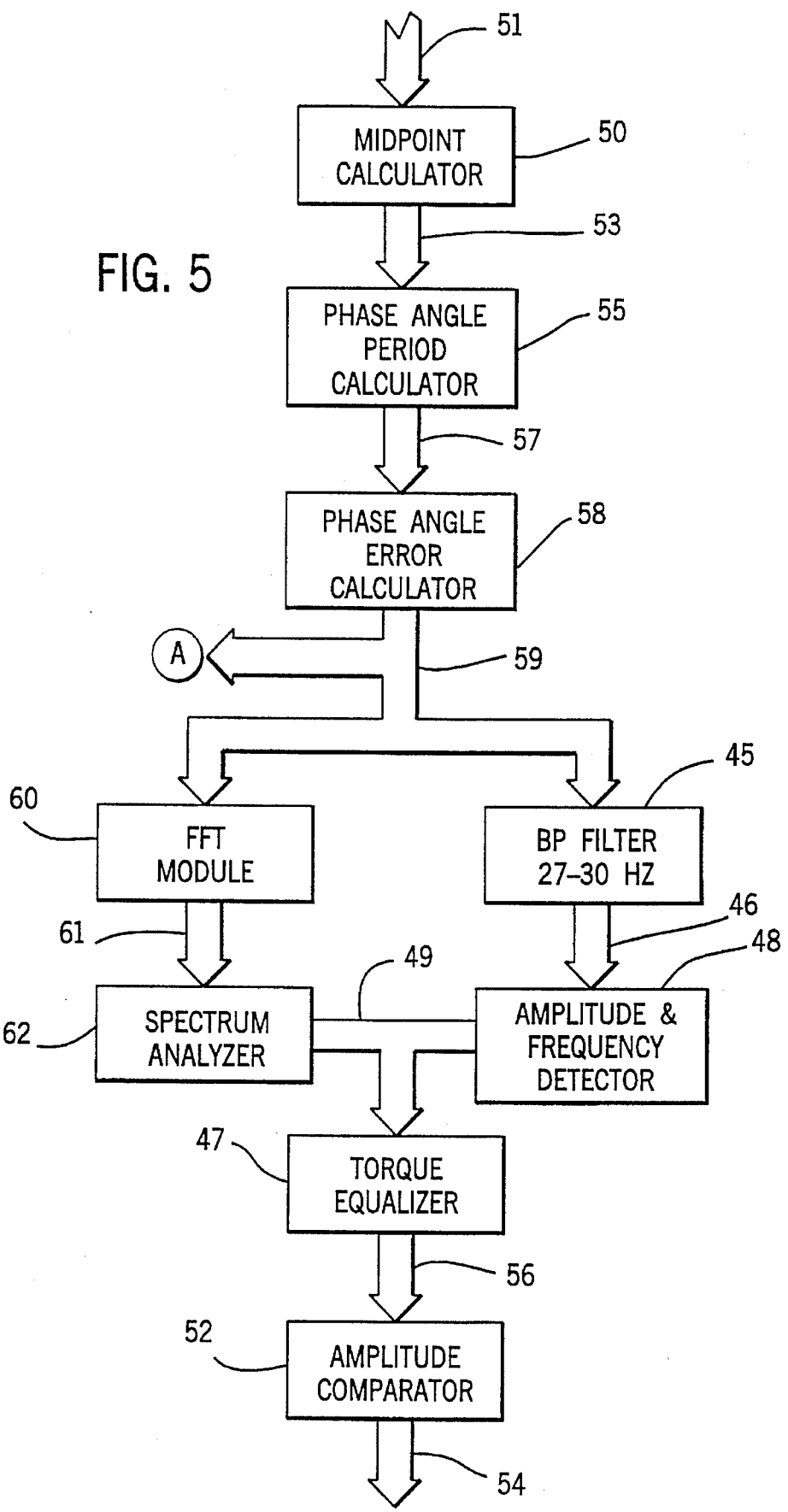
FIG. 5 is a flow chart depicting the operation of the control signal module which takes notch and zero crossing information and determines a value indicative of the degree of rotor winding failure.

Referring to FIG. 5, the microprocessor 19 carries out a number of different functions which are incorporated in computer code. It should be understood that while these functions are described as being implemented in software, they could be implemented in discrete solid state hardware as well, or part in hardware and part in software.

As the microprocessor 19 controls the thyristors 40, 42, and 44, the microprocessor 19 controls and therefore holds values for the notch durations $\gamma_a$, $\gamma_b$, and $\gamma_c$. The microprocessor 19 includes a midpoint calculator 50 which receives both zero crossing $z_a$, $z_b$, $z_c$ and notch duration $\gamma_a$, $\gamma_b$, $\gamma_c$ information 51. With this information, the midpoint calculator 50 can determines midpoints $m_a$, $m_b$ and $m_c$ according to the following equations:

$$m_a=z_a+\frac{\gamma_a}{2}; \quad (10)$$

$$m_b=z_b+\frac{\gamma_b}{2}; \text{ and} \quad (11)$$

$$m_c=z_c+\frac{\gamma_c}{2}. \quad (12)$$

As indicated above, these are the zero crossing points of the fundamental components of the line currents.

A set of signals of a magnitude easily useable for signal processing, representing the difference between midpoints $m_a$, $m_b$ and $m_c$ are derived. To accomplish this task, the midpoints $m_a$, $m_b$ and $m_c$, 53, are provided to a phase angle interval calculator 55 which determines the phase angles $\phi_{ab}$, $\phi_{bc}$, and $\phi_{ca}$, 57 between consecutive midpoints $m_a$, $m_b$, and $m_c$ according to the following equations:

$$\phi_{ab}=m_b-m_a; \quad (13)$$

$$\phi_{bc}=m_c-m_b; \text{ and} \quad (14)$$

$$\phi_{ca}=m_a-m_c. \quad (15)$$

Next, a phase angle error calculator 58 receives phase angles $\phi_{ab}$, $\phi_{bc}$, and $\phi_{ca}$, 57, and subtracts ⅙th of a stator supply current cycle period, or τ (60° in the preferred embodiment), from each phase angle $\phi_{ab}$, $\phi_{bc}$, and $\phi_{ca}$ according to the following equations:

$$\zeta_{bc}=\phi_{bc}-\tau; \quad (16)$$

$$\zeta_{ca}=\phi_{ca}-\tau; \text{ and} \quad (17)$$

$$\zeta_{ab}=\phi_{ab}-\tau. \quad (18)$$

to produce phase angle errors $\zeta_{ab}$, $\zeta_{bc}$, and $\zeta_{ca}$. Preferably, a series of phase angle errors is calculated over a period of approximately one second. In a preferred embodiment, operating at 60 Hz, calculations over approximately one second would yield 360 phase angle errors. All of the phase angle errors are stored in a mass storage unit (not shown) as an error signal sequence 59.

Predicting Rotor Failure From Error Signal Spectrum

Every source of unbalance, whether it be in the stator, the rotor, the supply, or some environmental source, effects the phase angles between successive current zero crossings and thus changes the error signal sequence 59. Some of the sources of unbalance are erratic while others are periodic.

Importantly, asymmetrical rotor windings act as a source of substantially periodic variations in the error signals 59 varying at the rotor speed frequency or harmonics of this frequency.

As a rotor rotates, current therein produces a rotor magnetic field directed radially outward toward the stator. Just as the stator magnetic field induces a voltage in the rotor windings, so to the rotor magnetic field induces a voltage, or back EMF, in the stator windings. Where rotor windings or the magnetic core are asymmetrical, the stator back EMF is unbalanced and the stator currents are affected to show small variations dependent on the rotor unbalance and speed.

The variations in stator current show up in the error signals 59 as a series of phase angle deviations. The frequency spectrum 61 of the phase angle deviations includes a component which may be identified whose frequency is identical to the speed of the rotor.

Thus, by determining the frequency of the rotor component, the rotor speed can be determined.

In addition, it has been observed that the degree of phase angle deviation increases at the rotor frequency as the degree of rotor asymmetry is increased. Importantly, as the degree of phase angle deviation increases, the amplitude of the rotor component of the error signal spectrum 61 also increases and thus, the amplitude of the rotor component is indicative of the degree of rotor winding failure. Thus, by observing the rotor component of the error signal spectrum 61, both the frequency of the rotor and information pertaining to the degree of rotor winding failure can be acquired.

Under normal circumstances the only source of unbalance acting at the rotor frequency is the rotor. Therefore, by comparing the amplitude of the rotor component during motor operation to the rotor component amplitude data from the same motor at an early stage in its lifetime when its rotor was known to be in good condition, a difference in rotor component amplitude can be used as an indicator of the degree of rotor failure.

For a p-pole motor operating at X cycles per second, the rotor frequency will be within a region of interest between $K((2X/p)-n)$ and $K(2X/p)$ Hz, where n is a number chosen by the controller designer usually on the order of 1, 2, or 3, but not necessarily an integer, and K is an integer. K need not be included in calculating the region of interest but allows harmonic frequencies to be studied. The effects of a periodic distortion in stator current often show up at multiples of their lowest frequency.

Thus, for a motor having 4 poles and driven with an alternating stator current at 60 Hz running at a typical speed in the range of 27 to 30 Hz (1620 to 1800 rpm) and an n value of 3, the error signal spectrum 59 should be evaluated to find a rotor component having a frequency within the region between 27 and 30 Hz. In addition, similar harmonic components could be located in regions between 54 and 60 Hz, 81 and 90 Hz . . . (e.g. where K is 2, 3, 4 . . . ).

This disclosure will focus on the lowest region of interest where K is 1, the motor has four poles, and the motor is operating at 60 Hz. Under these circumstances, the stator flux rotational frequency is at 30 Hz while the rotor frequency will normally be between 27 and 30 Hz, just a few Hz less than the stator flux frequency. This is because the operation of an induction motor requires some slip s between the stator field and the rotor conductors (i.e. current is only induced in the rotor conductors if the conductors are in a changing magnetic field) to operate properly.

The rotor component of the error signal spectrum can be determined in one of two ways. Referring to FIG. 5, one way is to input the error signal sequence 59 to an FFT module 60 which produces a phase angle or FFT spectrum 61. A spectrum analyzer 62 can locate the rotor component of the FFT spectrum at a frequency just below the stator flux frequency within the range of 27–30 Hz.

The frequency resolution of an FFT spectrum depends on the sampling period over which data is collected. Thus, if a frequency resolution of 0.1 Hz is desired, the phase angle error signals must be measured over a 10 second period (i.e. the frequency resolution is 1/T where T is the period of sampling). Unfortunately, if the motor speed varies during the sampling period, the spectral peaks on an FFT spectrum 61 smear out and are reduced in amplitude, thus making it difficult to identify and measure the degree of unbalance at the rotor frequency. Therefore, in most cases, this way of determining the rotor component from the error signal sequence 59 will not be used.

The second way to determine the rotor component of the error signal spectrum 59 overcomes the practical problems of the first. Referring still to FIG. 5, instead of observing the rotor frequency in the frequency domain, the phase angle errors 59 can be inputted to a 27–30 Hz bandpass filter 45 which passes periodic signals within the 27–30 Hz range within which range the rotor component lies. In the preferred embodiment the band pass filter would be a 7-stage cascaded second order Butterworth digital band pass filter with band pass frequencies from 27–30 Hz. The periodic signal 46 which emerges should be at the rotor frequency and can be observed in the time domain.

The periodic signal 46 is received by an amplitude and frequency detector 48 which determines the signal amplitude and signal frequency 49 of the periodic signal 46. The signal amplitude and signal frequency 49 are passed onto a torque equalizer 47.

While the signal amplitude 49 does increase as rotor winding asymmetry increases, it has been observed through experimentation that given a specific rotor winding asymmetry, the signal amplitude 49 decreases as motor load increases. Thus, the magnitude of the signal amplitude 49 is dependent on motor load as well as the degree of rotor failure.

The signal amplitude 49 can be made approximately independent of motor load by multiplying it either by the amplitude of the stator current, or by the instantaneous slip s of the motor. The slip s between the rotor frequency and the stator current frequency increases as motor load increases.

As known in the art, slip s is related to the stator flux frequency $f_s$ and the rotor frequency $f_r$ by the equation:

$$s = 1 - \frac{f_r}{f_s} \qquad (19)$$

Thus, the torque equalizer 47 receives the signal frequency $f_r$ and the stator flux frequency $f_s$ and uses Equation 19 to determine instantaneous slip s. Then the torque equalizer 47 multiplies the slip s and the signal amplitude 49 producing a rotor signal 56, the rotor signal 56 being approximately independent of motor load. The rotor signal 56 is received by an amplitude comparator 52.

The mass storage unit (not shown) includes earlier signal data representative of signal data when the rotor was healthy. The rotor signal 56 is compared to the healthy rotor signal data and a rotor condition signal 54 is derived. The magnitude of the rotor error signal 54 corresponds to the extent of rotor deterioration due to loose or cracked bars or winding faults. The rotor condition signal 54 can be quantified in any manner known in the art and displayed for an operator to evaluate.

As rotor winding failure is a gradual process, the above described method need not be continuously used. However, as the method is not extremely time consuming or computationally intensive, the method should probably be used on a daily basis to ensure proper rotor operation.

One advantage to observing the degree of unbalance in the time domain is that adequate accuracy can be achieved by sampling over a period of approximately 1 second, rather than the 10 seconds that are needed in the frequency domain. A related advantage is that the periodic rotor signal 46 follows speed changes in the motor due to load variation fairly directly, though with some delay due to the response of the band pass filter 45. There is no smearing out effect to make the signal less distinct due to speed changes, as when the FFT module 60 is used, so that frequency and amplitude measurements may easily be made.

The present invention also includes a method for predicting rotor winding failure. In a preferred method, a motor controller provides stator winding currents at a frequency of 60 Hz and indicates zero crossing times when each current is zero. The controller also provides a set of healthy rotor signal data, an acceptable rotor condition value, and a sampling period. The motor has 4 poles and the method comprises the steps of receiving consecutive zero crossing times from the motor controller, subtracting each zero crossing time from a preceding consecutive zero crossing time to produce a plurality of difference values, subtracting ⅙th of the stator winding current cycle period from each difference value to produce a plurality of error signals, each error signal indicating the variation period between consecutive current zero crossings, the plurality of error signals together forming an error signal sequence, passing the error signal sequence through a bandpass filter having a pass band between 27 and 30 Hz to produce a rotor signal component, determining the signal frequency and signal amplitude of the rotor component, dividing the signal frequency by 30 Hz to produce a frequency ratio, subtracting the frequency ratio from the integer one to produce a slip value, multiplying the rotor signal amplitude by the slip value (or by the stator current amplitude) to produce a rotor signal which is approximately dependent on the degree of rotor winding failure but independent of load torque, comparing the rotor signal to the healthy rotor signal data to produce a rotor condition signal indicative of deterioration of the degree of rotor and displaying the rotor condition signal for an operator to examine.

Predicting Stator Failure From Error Signal Spectrum

Beside being helpful in predicting rotor winding failure, the error signal sequence 59 can also be used along with other controller calculations to predict stator winding failure.

Importantly, if there is a current component at frequency $f_{current}$ then that current component will appear at the frequency $f_{ess}$ in the error signal spectrum 61 given by:

$$f_{ess} = |f_{current} - f_{supply} \pm K f_{sample}| \qquad (20)$$

where K is an integer, $f_{supply}$ is the supply frequency, and $f_{sample}$ is the sampling frequency. Since the measurements needed to generate the error signal spectrum 59 are taken at current zero crossings, the sampling frequency $f_{sample}$ is locked to the supply frequency $f_{supply}$. Because there are six zero crossings during each supply cycle, $f_{sample}$ is $6 f_{supply}$ and Equation 20 can be rewritten:

$$f_{ess} = |f_{current} - (1-6K) f_{supply}|; \; 0 \leq f_{ess} < \frac{1}{2} f_{sample} \qquad (21)$$

In Equation 21, the sign of $f_{current}$ is positive for positive sequence currents and negative for negative sequence currents. Consequently, the effect of odd harmonic currents arising from supply unbalance or stator asymmetry is to produce a frequency component in the phase angle spectrum at $2f_{supply}$ for the negative sequence current components, and no component for the positive sequence components.

Just as information concerning unbalance due to rotor winding asymmetry could be derived by analyzing the error signal spectrum within the range of the rotor speed frequencies (27–30 Hz), information concerning unbalance due to stator winding asymmetry can be derived by analyzing the error signal spectrum at $2f_{supply}$.

Figure 6:
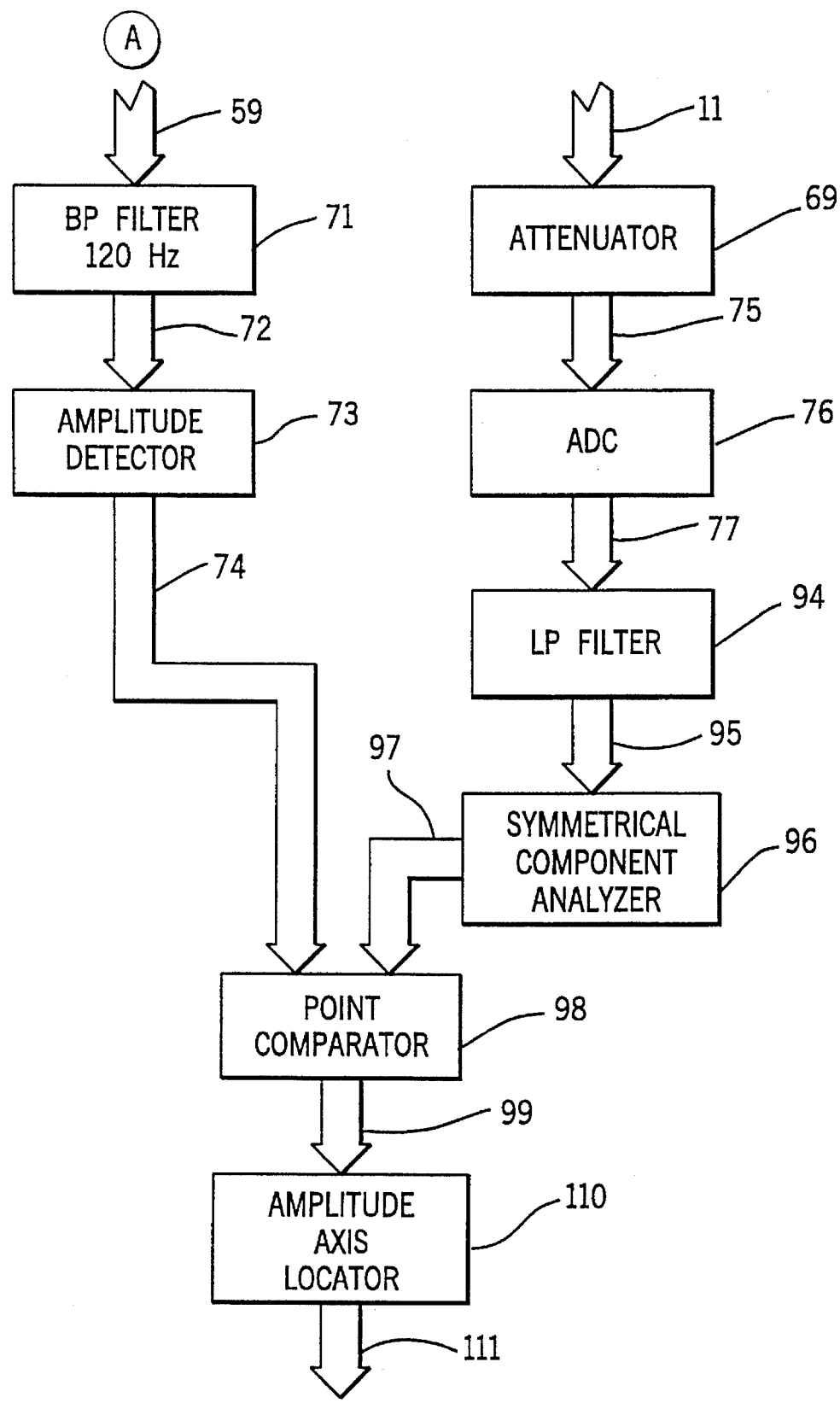
FIG. 6 is a flow chart depicting the operation of the control signal module which determines a value indicative of the degree of stator winding failure.

Referring to FIGS. 5 and 6, the phase angle errors 59 are supplied to a band pass filter 71 which passes the stator component 72 at $2f_{supply}$. In the preferred embodiment, where the supply frequency is 60 Hz, the filter 71 passes the stator component at 120 Hz. Next, an amplitude detector 73 determines a harmonic amplitude 74 of the stator component 72.

While the rotor is normally the only source of unbalance in its frequency range, unbalance in both the supply itself and in the stator windings can be sources of disturbances at the $2f_{supply}$ frequency. Therefore, in order to determine the extent of unbalance due to stator winding failure, the effects of the supply on harmonic amplitude 74 must be separated from the effect of the stator windings.

Referring again to FIG. 1, to separate the unbalance due to the stator windings from the unbalance due to the supply, as the voltage sensor 23 receives supply line voltages through resistors 78, 80, and 82 to determine current zero crossing times, it also isolates the supply voltage signal from each line 14, 16, 18 and provides those signals to the microprocessor 19 along line 11.

Referring again to FIG. 6, an attenuator 69 receives the supply voltage signals 11 and steps them down to an acceptable level for analog to digital conversion. An analog to digital converter 76 receives the attenuated signals 75 and produces a string of digital signals 77 which are passed through a low pass filter 94 that extracts the fundamental component 95 of each supply line voltage.

A symmetrical component analyzer 96 receives the fundamental components 95 and calculates a voltage ratio 97 of negative sequence over positive sequence supply voltage. As well known in the art, in order to derive the negative and positive sequence voltages, the fundamental components 95 of all three supply line voltage signals are placed together on the same axis.

To derive the negative sequence voltage, two of the fundamental components 95 are shifted to cancel out the effects of the positive sequence voltage. To derive the positive sequence voltage, two of the fundamental components are shifted in a different manner to cancel out the effects of the negative sequence voltage. The symmetrical component analyzer 96 divides the negative by the positive sequence voltages to obtain the voltage ratio 97.

A point comparator 98 receives both the voltage ratio 97 and the harmonic amplitude 74, combines the two into a coordinate pair and compares the coordinate pair to stator signal data stored in the mass storage unit (not shown).

Figure 7:
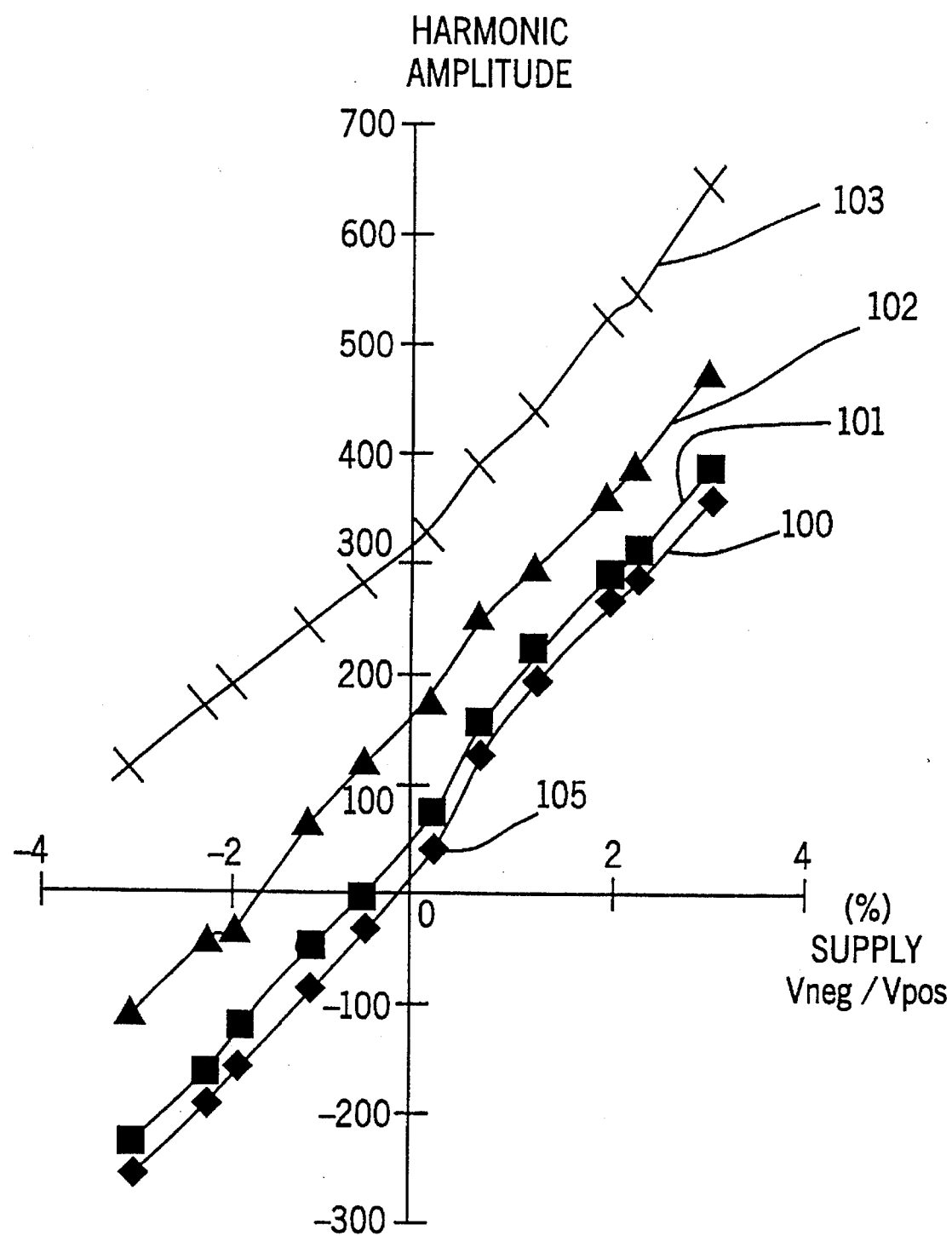
FIG. 7 is a graph illustrating the fluctuations in phase angles between consecutive current zero crossing times as a function of both the degree of stator winding failure and the degree of unbalance in supply voltage.

Referring to FIG. 7, a graph of representative stator signal data can be observed. On the graph, voltage ratio 97 is plotted on the X-axis while harmonic amplitude 74 is plotted on the Y-axis. The curves 100, 101, 102, and 103 represent the stator signal data for stator windings having different degrees of stator winding failure.

The data which describes curves 100, 101, 102, and 103 is generated by employing a motor wherein the degree of stator winding failure can be controlled. The voltage ratio is varied by controlling the individual supply voltages 14, 16, 18 by means of variable transformers to simulate supply unbalance. Curve 100 consists of voltage ratios 97 and harmonic amplitudes 74 generated for the motor without stator winding failure. Curve 101 consists of data generated for the motor with only a slightly unbalanced stator, (the unbalance being simulated by placing a small light bulb across two stator windings). Curve 102 consists of data generated for the motor with worse unbalance (simulated by a medium sized light bulb). And curve 103 consists of data generated with considerable unbalance (simulated by a relatively large light bulb).

In practice, variations in the supply voltage ratio would occur naturally due to unbalanced loading in the three phases due to the multitude of different equipment connected to the lines, which would vary throughout the day. If data is collected at different times of the day, different points on curve 100 could gradually be accumulated. The line would then represent the motor in its early life when in good condition. If this is repeated throughout the life of the motor, as the condition of the winding insulation deteriorates, and unbalance results, the curve would gradually take the form of 101, then 102—its intersection with the vertical axis representing the gradual deterioration in the condition of the motor.

Preferably, stator signal data is generated and stored in the mass storage unit which describes many more curves on the graph in FIG. 7 so that the coordinate pair derived will closely match one point on a distinct curve.

Importantly, when the supply voltage is balanced there is no negative sequence voltage component. Thus, where the voltage ratio 97 on the graph in FIG. 7 is zero (i.e. on the Y-axis), the harmonic amplitude 74 is due solely to stator winding failure. At point 105, where curve 100 crosses the Y-axis, stator winding unbalance is the sole origin of the harmonic amplitude 74. Similarly, the harmonic amplitudes 74 at the points where the other curves 101, 102, and 103 cross the Y-axis are entirely due to stator winding unbalance.

When the point comparator 98 compares the coordinate pair to the stator signal data, the point comparator locates a point on one of the curves 100, 101, 102, or 103 which corresponds closely to the coordinate pair. Next, the point comparator 98 associates the coordinate pair with one of the curves 100, 101, 102, or 103 and produces a curve signal 99.

The curve signal 99 is received by an amplitude axis locator 110 which determines harmonic amplitude 74 at the point where the curve 100, 101, 102, or 103 associated with the curve signal 99 crosses the harmonic amplitude axis. The amplitude axis locator 110 produces a stator error signal 111 indicative of the harmonic amplitude 74 on the harmonic amplitude axis.

As the supply line voltage is balanced at the points where the curves 100, 101, 102, and 103 cross the harmonic amplitude axis, the stator error signal 111 will be proportional to the unbalance caused by stator winding failure. Thus, by observing changes in the stator error signal 111 over the course of time, stator winding failure can be observed and predicted.

The invention also includes a method to be used with a motor controller, the motor controller providing three phase supply line voltages and stator winding currents at a frequency of 60 Hz and indicating zero crossing times when each current is zero, the controller also providing a set of stator signal data and a sampling period of approximately one second, the motor being of a design having 4 poles. The method predicts stator winding failure and comprises the steps of receiving consecutive zero crossing times from the motor controller, subtracting each zero crossing time from a preceding consecutive zero crossing time to produce a plurality of difference values, subtracting ⅛th of the stator period from each difference value to produce a plurality of error signals, the error signals together forming an error signal spectrum, passing the error signal spectrum through a bandpass filter passing the signal component at 120 Hz to produce a stator component, determining a harmonic amplitude of the stator component, the harmonic amplitude being the first element in a coordinate pair, sampling supply voltages over the sampling period, splitting the supply voltages into a positive sequence voltage and a negative sequence voltage, dividing the negative sequence voltage by the positive sequence voltage to produce a voltage ratio, the voltage ratio being the second coordinate in the coordinate pair, the harmonic amplitude and the voltage ratio together forming a coordinate pair, and comparing the coordinate pair to the stator signal data to produce a stator error signal.

The functionality of the control module 34 can also be implemented in software and used with already existing control modules 34. For example, as most smart motor controllers already monitor stator current zero crossing times and supply voltages, and most controllers control, and thus know, γ values, the microprocessor 19 can be used with the equations of the present invention and the data stored in the mass storage unit to determine rotor and stator winding asymmetry without additional sampling and without the need for additional hardware.

It should be understood that the above described embodiments are simply illustrative of the principles of this invention. Various other modifications and changes may be made by those skilled in the art which will embody the principals of the invention and fall within the spirit and scope thereof. For example, the apparatus of the present invention may include a module which receives both the rotor error signals 54 and the stator error signals 111, determines whether or not the error signals are within an acceptable error range, and if not, excites an alarm which indicates winding failure. In the alternative, the module could excite the alarm only when winding asymmetry experiences a rapid deterioration which might be more indicative of the sudden occurrence of a serious winding failure problem.

In addition, the method and apparatus of the present invention could be used with any type of motor, independent of pole and winding design, and independent of the frequency at which the motor operates. In order to appraise the public of the many embodiments that may fall within the scope of the invention, the following claims are made.

We claim:

1. A method to be used with a motor controller, the motor controller providing stator winding currents at a frequency of X cycles per second and indicating zero crossing times when each current is zero, a set of ideal rotor signal data, an acceptable rotor error value, and a sampling period, the motor being of a design having p poles, the method predicting rotor winding failure, the method comprising the steps of:

generating a sequence of error signals over the sampling period, each error signal indicating the period between consecutive current zero crossings, the plurality of error signals together forming an error signal spectrum; analyzing the error signal spectrum to determine a signal amplitude of a rotor component within a region of interest, the region of interest being frequencies between $K((2X/p)-n)$ and $K(2X/p)$ Hz, where n is less than $2x/p$ and K is an integer;

determining a slip value indicating the difference in stator current frequency and the rotor frequency;

multiplying the signal amplitude by the slip value to produce a rotor signal; and comparing the rotor signal to the ideal rotor signal data to produce a rotor error signal indicative of the degree of rotor failure.

2. The method as recited in claim 1 wherein the controller provides a stator period and the step of generating a plurality of error signals includes the steps of:

receiving consecutive zero crossing times from the motor controller;

subtracting each zero crossing time from a preceding consecutive zero crossing time to produce a plurality of difference values; and subtracting ⅙th of the stator period from each difference value to produce the plurality of error signals.

3. The method as recited in claim 1 wherein the step of analyzing the error signal sequence includes the step of determining a signal frequency of said rotor component and the step of determining a slip value includes the steps of dividing the signal frequency by K(2X/p) to produce a frequency ratio and subtracting the frequency ratio from the integer one to produce the slip value.

4. The method as recited in claim 1 wherein the controller provides a slip value and the step of determining a slip includes the step of receiving the slip value from the controller.

5. The method as recited in claim 3 wherein the step of analyzing the error signal sequence includes the steps of passing the error signal sequence through a bandpass filter to obtain the rotor component having a frequency within the region of interest and determining the frequency and amplitude of the rotor component to ascertain the signal frequency and the signal amplitude.

6. The method as recited in claim 3 wherein the step of analyzing the error signal spectrum includes the steps of performing a fast Fourier transform on the error signal spectrum to produce an FFT spectrum and examining the FFT spectrum within the frequency region of interest to find the signal frequency and the signal amplitude.

7. The method as recited in claim 1 wherein p is 4, X is 60, n is at most 3, K is 1 and the predetermined period is approximately one second.

8. The method as recited in claim 1 further including the step of displaying the rotor error signal.

9. An apparatus to be used with a motor controller, the motor controller providing stator winding currents at a frequency of X Hz and indicating zero crossing times when each current is zero, a set of ideal rotor signal data, an acceptable rotor error value, and a sampling period, the motor being of a design having p poles, the apparatus for predicting rotor winding failure, the apparatus comprising:

a period calculator to receive consecutive zero crossing times from the controller over the sampling period, subtracts each zero crossing time from a preceding consecutive zero crossing time to produce a plurality of difference values, and subtracts ⅙th of the stator winding current cycle period from each difference value to produce a plurality of error signals, the plurality of error signals together forming an error signal sequence;

a frequency analyzer to analyze the error signal sequence to determine a signal amplitude of a rotor component within a frequency region of interest between K((2X/p)−n) and K(2X/p) Hz, where n is less than 2X/p and K is an integer;

a slip calculator to determines a slip value indicating the difference in stator winding current frequency and the rotor frequency;

a rotor calculator to multiply the signal amplitude by the slip value to produce a rotor signal; and a comparator to compare the rotor condition signal to the rotor condition signal of the motor when it was healthy to produce a rotor error signal indicative of the degree of rotor failure.

10. The apparatus as recited in claim 9 wherein the frequency analyzer also analyzes the error signal sequence to determine a signal frequency of said rotor component and the slip calculator includes a divider to divide the signal frequency by K(2X/p) to produce a frequency ratio and a subtractor to subtract the frequency ratio from the integer one to produce the slip value.

11. The apparatus as recited in claim 10 wherein the frequency analyzer includes:

a bandpass filter having a bandpass to receive the error signal sequence and pass the rotor component having a frequency within the region of interest;

a frequency indicator that determines the signal frequency by determining the frequency of the rotor component; and an amplitude indicator that determines the signal amplitude by determining the amplitude of the rotor component.

12. The apparatus as recited in claim 9 wherein the controller provides a slip value and the slip calculator determines the slip value by receiving the slip value from the controller.

13. The apparatus as recited in claim 9 wherein p is 4, X is 60, n is 3, K is 1, and the predetermined period is approximately one second.

14. A method to be used with a motor controller, the motor controller providing stator winding currents at a frequency of 60 Hz and indicating zero crossing times when each current is zero, a set of ideal rotor signal data, an acceptable rotor error value, and a sampling period, the motor being of a design having 4 poles, the method predicting rotor winding failure, the method comprising the steps of:

receiving consecutive zero crossing times from the motor controller;

subtracting each zero crossing time from a preceding consecutive zero crossing time to produce a plurality of difference values;

subtracting ⅙th of the stator winding current cycle period from each difference value to produce a plurality of error signals, each error signal indicating the period between consecutive current zero crossings, the plurality of error signals together forming an error signal sequence;

passing the error signal sequence through a bandpass filter having a bandpass between 27 and 30 Hz to produce a rotor component;

determining a signal frequency and a signal amplitude of the rotor component;

dividing the signal frequency by 30 to produce a frequency ratio;

subtracting the frequency ratio from the integer one to produce a slip value;

multiplying the signal amplitude by the slip value to produce a rotor condition signal;

comparing the rotor condition signal to the healthy rotor condition signal data to produce a rotor error signal; and displaying the rotor error signal.

15. A method to be used with a motor controller, the motor controller providing three phase supply line voltages and stator winding currents at a frequency of X Hz and indicating zero crossing times when each current is zero, the controller also providing a set of stator signal data and a sampling period, the motor being of a design having p poles, the method predicting stator winding failure, the method comprising the steps of:

generating a plurality of error signals over the sampling period, each error signal indicating the time between consecutive current zero crossings, the plurality of error signals together forming an error signal sequence;

analyzing the error signal sequence to determine a harmonic amplitude of a stator component of the error signal spectrum at 2X Hz, the harmonic amplitude being the first element in a coordinate pair;

sampling supply voltages over the sampling period;

splitting the supply voltages into a positive sequence voltage and a negative sequence voltage;

dividing the negative sequence voltage by the positive sequence voltage to produce a voltage ratio, the voltage ratio being the second coordinate in the coordinate pair, the harmonic amplitude and the voltage ratio together forming a coordinate pair; and comparing the coordinate pair to the stator signal data to produce a stator error signal.

16. The method as recited in claim 15 wherein the step of generating a plurality of stator error signals includes the steps of:

receiving consecutive zero crossing times from the motor controller;

subtracting each zero crossing time from a preceding consecutive zero crossing time to produce a plurality of difference values; and subtracting ⅙th of the stator period from each difference value to produce the plurality of error signals.

17. The method as recited in claim 15 wherein the step of sampling the supply voltages includes the step of sampling all three of the supply line voltages consecutively, and the step of splitting the supply voltage includes the steps of:

passing each supply voltage signal through an analog to digital converter producing three digital voltage signals;

passing the digital voltage signals through a low pass filter to produce three fundamental voltage signals;

shifting the phase of two of the fundamental voltage signals to produce a positive sequence voltage signal wherein the negative sequence voltage is canceled out; and shifting the phase of two of the fundamental voltage signals to produce a negative sequence voltage signal wherein the positive sequence voltage is canceled out.

18. The method as recited in claim 15 wherein the set of stator signal data includes data describing a series of curves on a graph, each curve representing voltage ratios plotted against harmonic amplitudes for a specific degree of stator winding fault, the degree of stator winding fault being different for each curve, and the step of comparing the coordinate pair to the stator signal data includes the steps of:

locating a coordinate point on one of the curves, the coordinate point corresponding to the coordinate pair;

determining a point curve, said point curve being the curve on which said coordinate point is located;

correlating the point curve with a specific degree of stator winding fault; and producing the stator error signal.

19. The method as recited in claim 18 wherein the set of stator signal data also includes stator error data indicating harmonic amplitudes for each curve where the voltage ratio is zero, and the step of determining on which curve said coordinate is located includes the steps of:

determining the harmonic amplitude on said curve when the voltage ratio is zero to produce a zero amplitude signal; and comparing the zero amplitude signal to the stator error data to produce the stator error signal.

20. An apparatus to be used with a motor controller, the motor controller providing three phase supply line voltages and stator winding currents at a frequency of X Hz and indicating zero crossing times when each current is zero, the controller also providing a set of stator signal data and a sampling period, the motor being of a design having p poles, the apparatus for predicting stator winding failure, the apparatus comprising:

a period calculator that receives consecutive zero crossing times from the controller over the sampling period, subtracts each zero crossing time from a preceding consecutive zero crossing time to produce a plurality of difference values, and subtracts ⅙th of the stator winding supply voltage cycle period from each difference value to produce a plurality of error signals the error signals together forming an error signal sequence;

a frequency analyzer to analyzes the error signal sequence to determine a harmonic amplitude of a stator component at 2X Hz, the harmonic amplitude being the first element in a coordinate pair;

a sensor for sampling supply voltages over the sampling period;

a voltage splitter that splits the supply voltages into a positive sequence voltage and a negative sequence voltage;

a voltage divider that divides the negative sequence voltage by the positive sequence voltage to produce a voltage ratio, the voltage ratio being the second coordinate in the coordinate pair, the harmonic amplitude and the voltage ratio together forming a coordinate pair;

a comparator that compares the coordinate pair to the stator signal data to produce a stator error signal; and a display which receives and displays the stator error signal.

21. The apparatus as recited in claim 20 wherein the set of stator signal data includes data describing a series of curves on a graph, each curve representing voltage ratios plotted against harmonic amplitudes for a specific degree of stator winding fault, the degree of stator winding fault being different for each curve, and the comparator includes:

a point locator which places a coordinate point on one of the curves, the coordinate point corresponding to the coordinate pair;

a curve indicator which determines on which curve said coordinate point is located; and an error signal generator which produces the stator error signal.

22. A method to be used with a motor controller, the motor controller providing three phase supply line voltages and stator winding currents at a frequency of X Hz and indicating zero crossing times when each current is zero, the controller also providing a set of stator signal data and a sampling period, the motor being of a design having p poles, the method predicting stator winding failure, the method comprising the steps of:

receiving consecutive zero crossing times from the motor controller;

subtracting each zero crossing time from a preceding consecutive zero crossing time to produce a plurality of difference values;

subtracting 1/6th of the stator period from each difference value to produce a plurality of error signals, the error signals together forming an error signal sequence;

passing the error signal spectrum through a bandpass filter having a bandpass at 2X Hz to produce a stator signal;

determining a harmonic amplitude of the stator signal, the harmonic amplitude being the first element in a coordinate pair;

sampling supply voltages over the sampling period;

splitting the supply voltages into a positive sequence voltage and a negative sequence voltage;

dividing the negative sequence voltage by the positive sequence voltage to produce a voltage ratio, the voltage ratio being the second coordinate in the coordinate pair, the harmonic amplitude and the voltage ratio together forming a coordinate pair; and comparing the coordinate pair to the stator signal data to produce a stator error signal.

23. The method as recited in claim 22 wherein the set of stator signal data includes data describing a series of curves on a graph, each curve representing voltage ratios plotted against harmonic amplitudes for a specific degree of stator winding fault, the degree of stator winding fault being different for each curve, and the stator signal data also includes voltage zero data indicating harmonic amplitudes for each curve where the voltage ratio is zero, and the step of comparing the coordinate pair to the stator signal data includes the steps of:

locating a coordinate point on one of the curves, the coordinate point corresponding to the coordinate pair;

determining the harmonic amplitude on said curve when the voltage ratio is zero to produce a zero amplitude value;

comparing the zero amplitude value to the voltage zero data to determine on which curve said coordinate point is located; and producing the stator error signal.

* * * * *